(12) United States Patent
Borkovic et al.

(10) Patent No.: US 6,643,829 B1
(45) Date of Patent: Nov. 4, 2003

(54) REDUCING CLOCK SKEW IN CLOCK GATING CIRCUITS

(75) Inventors: Drazen Borkovic, Mountain View, CA (US); Kenneth S. McElvain, Los Altos, CA (US)

(73) Assignee: Synplicity, Inc., Sunnyvale, CA (US)

( * ) Notice: Subject to any disclaimer, the term of this patent is extended or adjusted under 35 U.S.C. 154(b) by 0 days.

(21) Appl. No.: 10/016,214

(22) Filed: Dec. 6, 2001

(51) Int. Cl.[7] .............................................. G06F 17/50

(52) U.S. Cl. .............................................. 716/3; 716/4

(58) Field of Search .............................. 716/3, 4, 6, 18; 703/13–15, 19

(56) References Cited

U.S. PATENT DOCUMENTS 6,301,553 B1 * 10/2001 Burgun et al. ................ 703/15

* cited by examiner

Primary Examiner—Leigh M. Garbowski
Assistant Examiner—Naum Levin
(74) Attorney, Agent, or Firm—Blakely, Sokoloff, Taylor & Zafman LLP

(57) ABSTRACT

One embodiment of the present invention includes a technique for a gated clock conversion for a circuit which includes a gating circuit and a sequential element. The gating circuit has a gated clock net that drives a clock input of the sequential element. The sequential element receives a first input net at a data input and generates an output net. The gating circuit has a user-defined clock net. The technique includes determining the gating circuit and transforming the gating circuit to provide a second input net to the sequential element based on a cofactor condition of the gating circuit.

15 Claims, 12 Drawing Sheets

REDUCING CLOCK SKEW IN CLOCK GATING CIRCUITS

BACKGROUND

1. Field of the Invention

This invention relates to digital circuits. In particular, the invention relates to clock gating circuits.

2. Description of Related Art

Synchronous sequential circuits rely on their clock signals for reliable operations. Clocked sequential elements such as flip-flops or registers transfer input data to output data at the transition of the clock signal. For proper loading, the input data have to meet the set-up and hold time requirements. Since these critical timing parameters are determined with respect to the clock signal, any clock skew or delay may cause timing violations, resulting in erroneous data loading. In addition, clock skews may also limit the operating frequency range, leading to degraded performance.

There are several sources that may cause clock skew in sequential circuits. One of the major sources is the use of gating circuitry to selectively enable or disable the clock signal. A typical gating circuitry may involve several levels of gating circuits, often in the form of AND or OR gates. These gates introduce undesirable delays and cause unpredictable timing problems. The problem is even more pronounced when circuits are prototyped in programmable devices such as field programmable logic arrays (FPGA's). In these programmable logic devices, the gated clock signals are typically routed on the general routing network due to the limited number of available dedicated clock routing networks. The general routing network usually introduces significant delays and unequal distribution of clocking signals to various sequential elements, causing clock skews at the clock inputs of the sequential elements.

One technique to reduce clock skew is to use delay elements at various points in the clock signal paths to compensate for the unequal delays. This technique increases amount of hardware and circuit complexity. In addition, the delay elements may have their own delay variations which may not compensate well.

Therefore, there is a need to have an efficient technique to reduce clock skews and clock delays in sequential circuits.

BRIEF DESCRIPTION OF THE DRAWINGS

The features and advantages of the present invention will become apparent from the following detailed description of the present invention in which.

DESCRIPTION

One embodiment of the present invention includes a technique for a gated clock conversion for a circuit which includes a gating circuit and a sequential element. The gating circuit has a gated clock net that drives a clock input of the sequential element. The sequential element receives a first input net at a data input and generates an output net. The gating circuit has a user-defined clock net. The technique includes determining the gating circuit and transforming the gating circuit to provide a second input net to the sequential element based on a cofactor condition of the gating circuit. The technique reduces clock skew, simplifies the gated clock circuit, and provides better tolerance for delay variations.

In the following description, for purposes of explanation, numerous details are set forth in order to provide a thorough understanding of the present invention. However, it will be apparent to one skilled in the art that these specific details are not required in order to practice the present invention. In other instances, well-known electrical structures and circuits are shown in block diagram form in order not to obscure the present invention.

Figure 1:
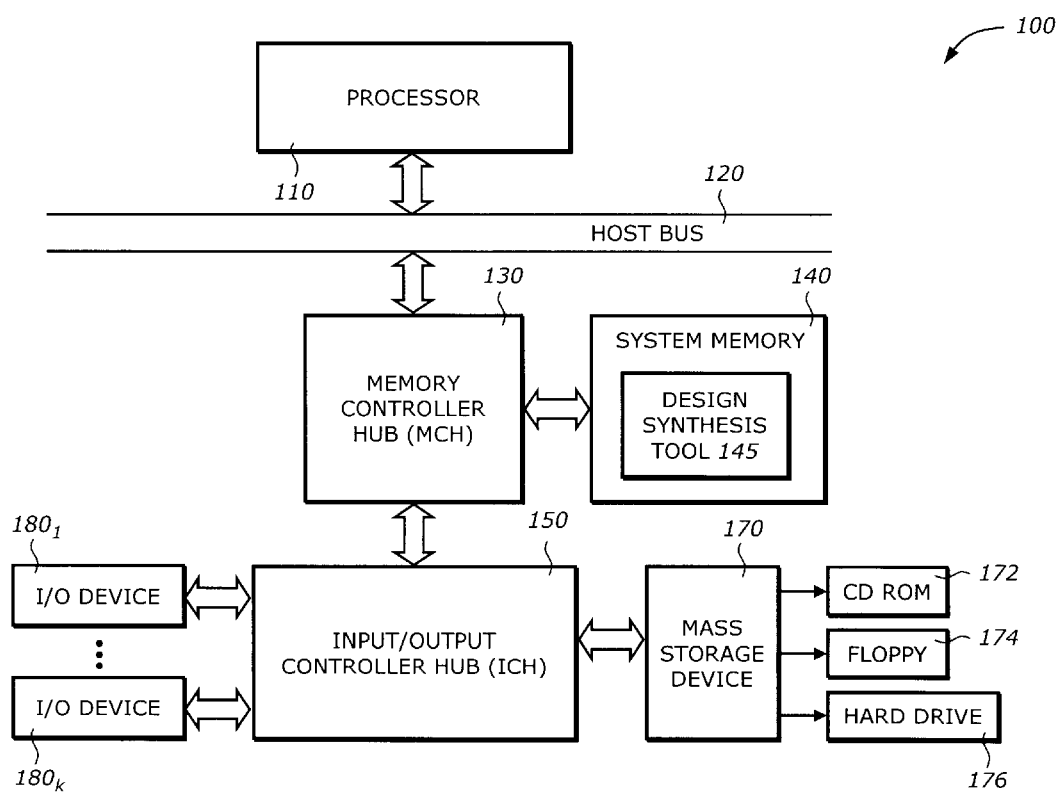
FIG. 1 is a diagram illustrating a system in which one embodiment of the invention can be practiced.

FIG. 1 is a diagram illustrating a computer system 100 in which one embodiment of the invention can be practiced. The computer system 100 includes a processor 110, a host bus 120, a memory control hub (MCH) 130, a system memory 140, an input/output control hub (ICH) 150, a mass storage device 170, and input/output devices $180_1$ to $180_K$.

The processor 110 represents a central processing unit of any type of architecture, such as embedded processors, micro-controllers, digital signal processors, superscalar computers, vector processors, single instruction multiple data (SIMD) computers, complex instruction set computers (CISC), reduced instruction set computers (RISC), very long instruction word (VLIW), or hybrid architecture. The host bus 120 provides interface signals to allow the processor 110 to communicate with other processors or devices, e.g., the MCH 130. The host bus 120 may support a uni-processor or multiprocessor configuration. The host bus 120 may be parallel, sequential, pipelined, asynchronous, synchronous, or any combination thereof.

The MCH 130 provides control and configuration of memory and input/output devices such as the system memory 140 and the ICH 150. The MCH 130 may be integrated into a chipset that integrates multiple functionalities such as the isolated execution mode, host-to-peripheral bus interface, memory control. For clarity, not all the peripheral buses are shown. It is contemplated that the system 100 may also include peripheral buses such as Peripheral Component Interconnect (PCI), accelerated graphics port (AGP), Industry Standard Architecture (ISA) bus, and Universal Serial Bus (USB), etc.

The system memory 140 stores system code and data. The system memory 140 is typically implemented with dynamic random access memory (DRAM) or static random access memory (SRAM). The system memory may include program code or code segments implementing one embodiment of the invention. The system memory includes a design synthesis tool 145. The design synthesis tool 145 may also be implemented by hardware, software, firmware, microcode, or any combination thereof. The system memory 140 may also include other programs or data which are not shown, such as an operating system.

The ICH 150 has a number of functionalities that are designed to support I/O functions. The ICH 150 may also be integrated into a chipset together or separate from the MCH 130 to perform I/O functions. The ICH 150 may include a number of interface and I/O functions such as PCI bus interface, processor interface, interrupt controller, direct memory access (DMA) controller, power management logic, timer, universal serial bus (USB) interface, mass storage interface, low pin count (LPC) interface, etc.

The mass storage device 170 stores archive information such as code, programs, files, data, applications, and operating systems. The mass storage device 170 may include compact disk (CD) read-only memory (ROM) 172, floppy diskettes 174, and hard drive 176, and any other magnetic or optic storage devices. The mass storage device 170 provides a mechanism to read processor or machine-readable media as discussed below.

The I/O devices $180_I$ to $180_K$ may include any I/O devices to perform I/O functions. Examples of I/O devices $180_I$ to $180_K$ include controller for input devices (e.g., keyboard, mouse, trackball, pointing device), media card (e.g., audio, video, graphics), network card, and any other peripheral controllers.

The present invention may be implemented by hardware, software, firmware, microcode, or any combination thereof. When implemented in software, firmware, or microcode, the elements of the present invention are the program code or code segments to perform the necessary tasks. A code segment may represent a procedure, a function, a subprogram, a program, a routine, a subroutine, a module, a software package, a class, or any combination of instructions, data structures, or program statements. A code segment may be coupled to another code segment or a hardware circuit by passing and/or receiving information, data, arguments, parameters, or memory contents. Information, arguments, parameters, data, etc. may be passed, forwarded, or transmitted via any suitable means including memory sharing, message passing, token passing, network transmission, etc. The program or code segments may be stored in a processor readable medium or transmitted by a computer data signal embodied in a carrier wave, or a signal modulated by a carrier, over a transmission medium. The "processor readable medium" may include any medium that can store or transfer information. Examples of the processor readable medium include an electronic circuit, a semiconductor memory device, a ROM, a flash memory, an erasable ROM (EROM), a floppy diskette, a compact disk CD-ROM, an optical disk, a hard disk, a fiber optic medium, a radio frequency (RF) link, etc. The computer data signal may include any signal that can propagate over a transmission medium such as electronic network channels, optical fibers, air, electromagnetic, RF links, etc. The code segments may be downloaded via computer networks such as the Internet, Intranet, etc. As will be described in the following, the processor readable medium may contain computer readable program code to generate cofactors, to transform gating circuit, to collect a set of gated dock nets, to collect internal gates, etc.

It is noted that the invention may be described as a process which is usually depicted as a flowchart, a flow diagram, a structure diagram, or a block diagram. Although a flowchart may describe the operations as a sequential process, many of the operations can be performed in parallel or concurrently. In addition, the order of the operations may be rearranged. A process is terminated when its operations are completed. A process may correspond to a method, a function, a procedure, a subroutine, a subprogram, etc. When a process corresponds to a function, its termination corresponds to a return of the function to the calling function or the main function.

Figure 2:
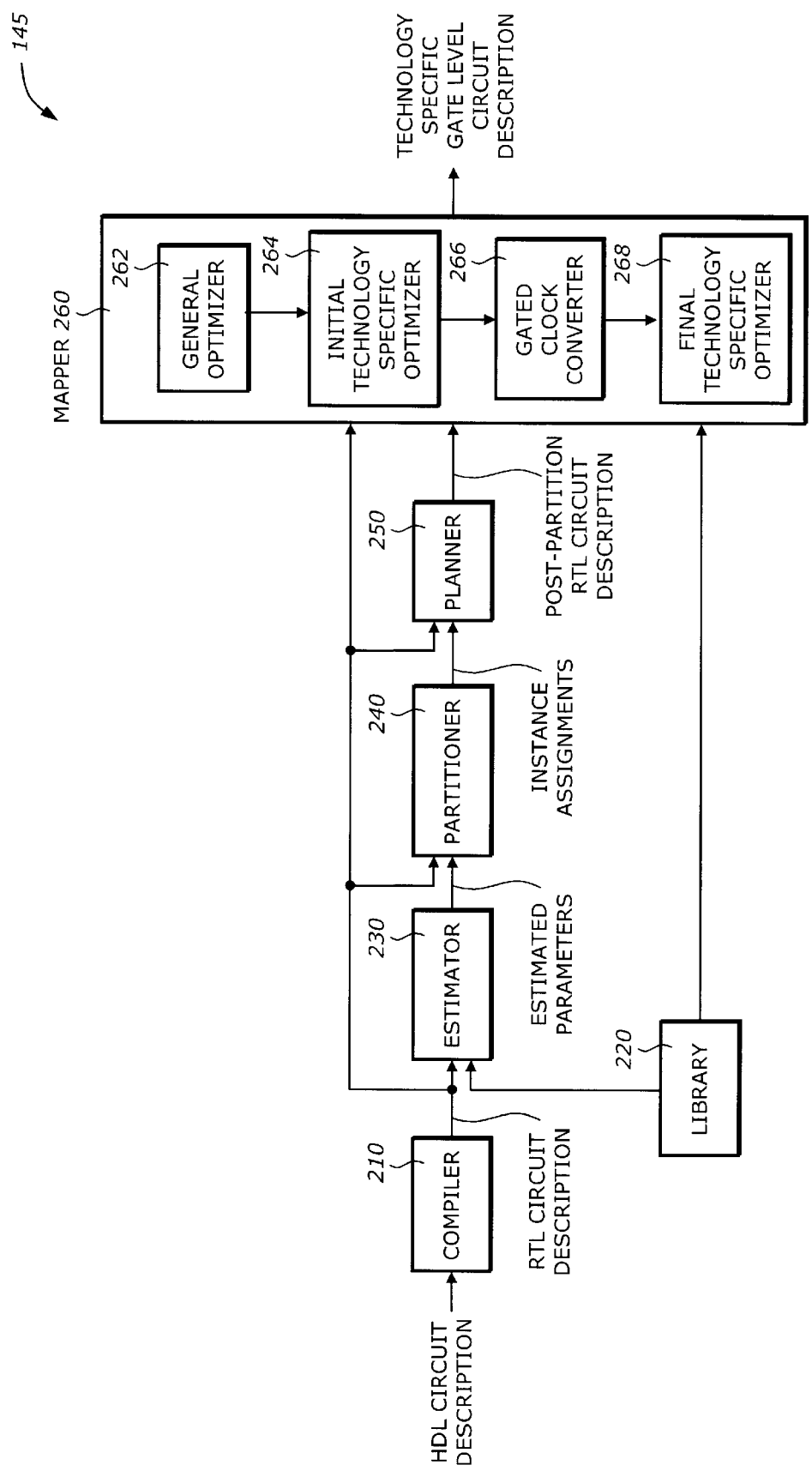
FIG. 2 is a diagram illustrating a design synthesis tool shown in FIG. 1 according to one embodiment of the invention.

FIG. 2 is a diagram illustrating a design synthesis tool 145 shown in FIG. 1 according to one embodiment of the invention. The design synthesis tool 145 includes a compiler 210, a library 220, an estimator 230, a partitioner 240, a planner 250, and a mapper 260. Note that this is only for illustrative purposes. The design synthesis tool 100 may have more or less components than listed above. For example, the design synthesis tool 100 may include the compiler 210, the library 220, and the mapper 260. The design synthesis tool 145 may be a software package in a computer aided design (CAD) environment. The design synthesis tool 145 is used by design engineers for designing, synthesizing, and simulating a circuit or a project. The design synthesis tool 145 may be used as part of a design process for Applications Specific Integrated Circuit (ASIC) devices, programmable device such as programmable logic devices (PLD), complex PLD (CPLD), field programmable logic array (FPGA), etc.

The compiler 210 compiles a source program containing a hardware description language (HDL) circuit description. The HDL may be any appropriate HDL such as Very High Speed Integrated Circuit Hardware Description Language (VHDL) or Verilog. The compiler 210 generates a register transfer level (RTL) circuit description from the HDL circuit description. The library 220 contains previously compiled circuit descriptions, vendors' circuit descriptions, functions, packages, or any other useful components that can be linked, combined, and integrated with the current RTL circuit description. The estimator 230 estimates functional and/or physical parameters related to the circuit or project. Some examples of the parameters include the circuit complexity (e.g., number of gates), circuit size, power consumption, overall timings, etc. The estimator 230 receives the RTL circuit description from the compiler 210 and other information from the library 220 to generate the estimated parameters.

The partitioner 250 generates instance assignments based on the RTL circuit description and the estimated parameters.

The planner 250 generates post-partition RTL circuit description from the RTL circuit description and the instance assignments.

The mapper 260 generates technology-specific gate level circuit description from the post-partition RTL circuit description and other useful information from the library 220. The mapper 260 may also generates the technology-specific gate level circuit description directly from the RTL circuit description and the library information. The mapper 260 includes a general optimizer 262, an initial technology specific optimizer 264, a gated clock converter 266, and a final technology specific optimizer 268. The general optimizer 262 optimizes the gate level circuit description without considering the specific technology or device that the circuit will eventually be implemented. The initial technology specific optimizer 264 performs the initial optimization based on the general optimization. The gated clock converter 266 further optimizes the circuit description by reducing clock skew, re-organizing gated clock circuits, and reconnecting clock nets and other related nets. The final technology specific optimizer 268 generates the final optimized gate level circuit description specifically for the technology to be used such as the specific selected device. The final optimized gate level circuit description may then be simulated and downloaded into the specific device for physical implementation. The gated clock converter 266 is typically a program code, a function, a subprogram, a procedure, or a routine which, when executed, causes the processor 110 to perform the tasks as will be explained later.

The gating circuitry in the original ASIC circuit combines the clock signal and the control (gating) signals. The output of this circuitry (the gated-clock signal) is connected to the clock pin of a sequential element (for example, a flip-flop). Such circuitry satisfies the following three conditions: (a) for certain combinations of the gating signals, the gated-clock signal is disabled (i.e., it does not change with clock signal changes) to prevent the sequential element from changing its state; (b) for the remaining combinations of the gating signals, apart from the delay introduced by the gating circuitry, the gated-clock signal equals either the clock signal or its inverted value; and (c) finally,:all gated-clock signal transitions should result from only the clock signal transitions, and no enable signal transition can result in a gated clock signal transition. To ensure such behavior, there is a value of the clock signal where the gated-clock signal is insensitive to an enable signal change.

Figure 9A:
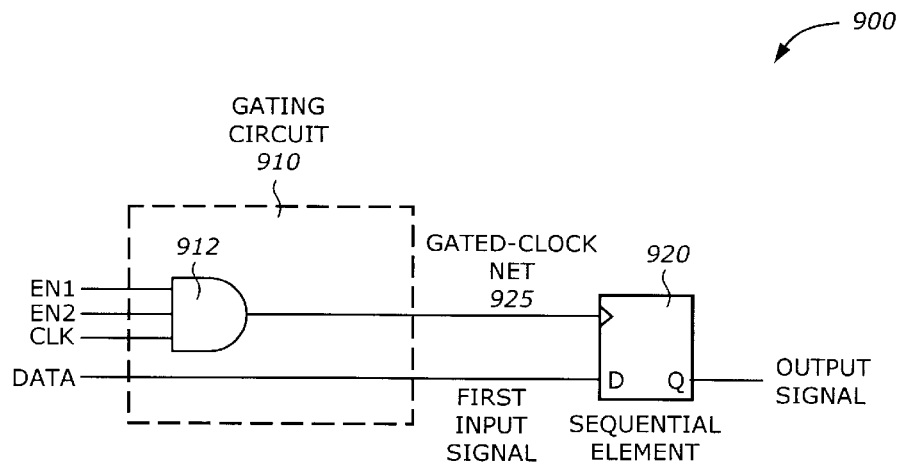
FIG. 9A is a diagram illustrating an example of a circuit with an gating circuit using multiple-input AND gate according to one embodiment of the invention.

The most common gating circuitry consists of an AND gate with the clock signal applied to one input pin of the gate and the control signals applied to the remaining input pins. The output of the AND gate is the gated clock as shown in FIG. 9A. When the correct combination of gating signals is present (all TRUE for the circuit in FIG. 9A), the output of the AND gate is allowed to follow the clock signal, which updates the sequential element. The clock is blocked when the value of any non-clock input signal is FALSE.

In general, let gclk=F(clk, en) be the Boolean function that describes the relation between the output, the gated clock (gclk), and the inputs, the clock (clk) and multiple enable signals (en). Its Shannon expansion is:

$$F(clk, \underline{en}) = clk * F_{clk=1}(\underline{en}) + \neg\, clk * F_{clk=0}(\underline{en}) \qquad (1)$$

The functions $F_{clk=1}(\underline{en})$ and $F_{clk=0}(\underline{en})$ are the positive and the negative cofactors of F with respect to the input clk. The three conditions (a), (b), and (c), are equivalent to the requirement that one of the two cofactors of F with respect to clk is a constant function (0 or 1) and the other is a non-constant function. Note that this requirement pertains to the cofactors of F as Boolean functions regardless of the structure of the concrete implementations of the function.

The previous conditions result in four possible types of clock gating functions:

TABLE 1

Types of clock gating functions

1. $F(clk, \underline{en}) = clk*F_{clk=1}(\underline{en})$ when $F_{clk=0}(\underline{en})$ is 0.
2. $F(clk, \underline{en}) = \neg clk*F_{clk=0}(\underline{en})$ when $F_{clk=1}(\underline{en})$ is 0.
3. $F(clk, \underline{en}) = clk + F_{clk=0}(\underline{en})$ when $F_{clk=1}(\underline{en})$ is 1.
4. $F(clk, \underline{en}) = \neg clk + F_{clk=1}(\underline{en})$ when $F_{clk=0}(\underline{en})$ is 1.

In the transformed circuit, the following signals are connected to the clock and enable inputs of the sequential element:

TABLE 2

Clock and enable pin functions of the transformed circuit.

| Clock pin | Enable pin |
| --- | --- |
| 1. clk | $F_{clk=1}(\underline{en})$ |
| 2. ¬clk | $F_{clk=0}(\underline{en})$ |
| 3. clk | $\neg F_{clk=0}(\underline{en})$ |
| 4. ¬clk | $\neg F_{clk=1}(\underline{en})$ |

If the sequential element does not have an enable signal, the algorithm introduces a multiplexer in the data path of the sequential element; the select input of the multiplexer serves as the enable input.

Figure 10A:
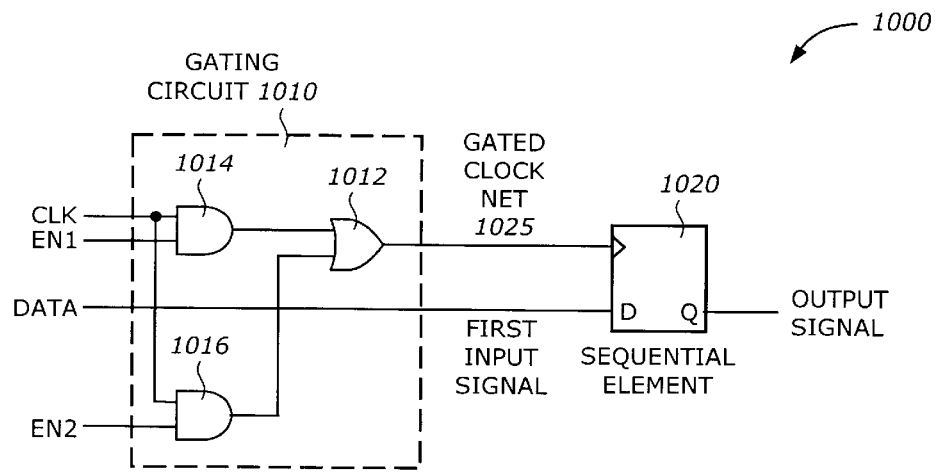
FIG. 10A is a diagram illustrating an example of a circuit with an AND-OR tree according to one embodiment of the invention.
Figure 10B:
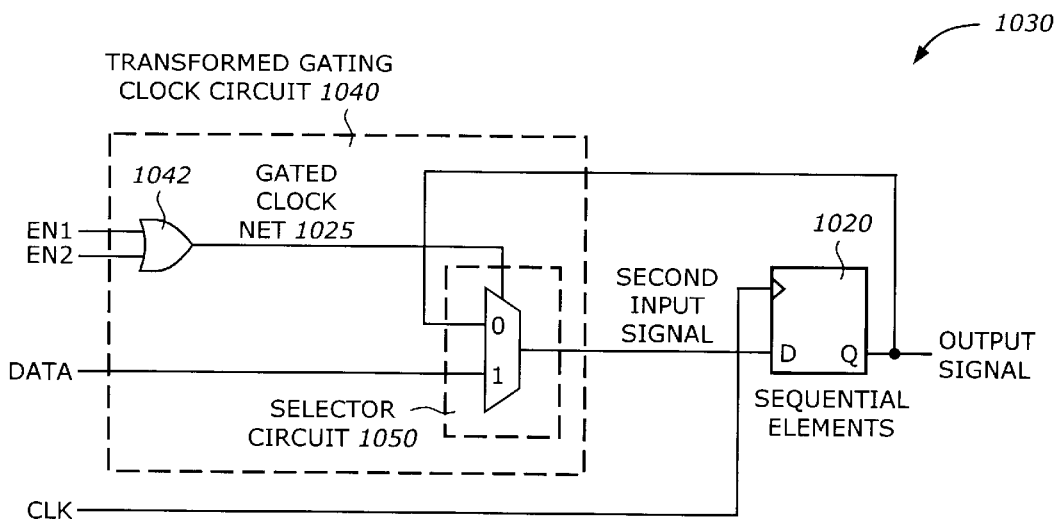
FIG. 10B is a diagram illustrating an example of a circuit with an AND-OR tree after the transformation according to one embodiment of the invention.

To apply the transformation, the algorithm identifies the driving circuit that satisfies one of the four conditions in Table 1. FIG. 10A shows a complex gating circuit that satisfies the first condition of Table 1. The enable function for this circuit is $F_{clk=1}$(en1, en2)=en1+en2. The transformed circuit is shown in FIG. 10B. The sequential element does not have an enable input, and a multiplexer has been inserted in the datapath.

In the description that follows, the term "net" refers to a link, a connection, or a wiring to connect one terminal to another terminal, or one pin of a device to another pin of the same device or another device. In this context, the term "net" may also refer to a signal existing on the link, the connection, or the wiring connecting one terminal to another terminal. Accordingly, terms such as clock signal, input signal, and output signal may be referred to as clock net, input net, and output net, respectively.

The technique in the present invention includes generating cofactors of a Boolean function of the gating circuit and transforming the gating circuit. The technique further includes collecting a set of gated clock nets including the gated clock net, selecting the user-defined clock net in user-defined clocks, and collecting internal gates between the gated clock net and the user-defined clock net. The collecting of the internal gates includes collecting intermediate gates in a subcircuit of the gating circuit, initializing an input set, selecting an input of one of the intermediate gates where the input has an input driver, and adding the input to the input set if the driver is not marked and the input is not in the input set. The collecting of the intermediate gates includes performing a search of gates in the gating circuit starting from the user-defined clock net, marking a candidate gate in the gates as an intermediate gate if the candidate gate drives one of the gated clock net and a neighboring gate that has been marked after visiting all forward neighbors of the candidate gate, and stopping the search when one of a primary input, the sequential element, and the gated clock net is reached.

The generating of the cofactors includes determining a Boolean function of the gating circuit with respect to the user-defined clock net, obtaining a positive cofactor of the Boolean expression by substituting a true value for the user-defined clock net in the Boolean expression, obtaining a negative cofactor of the Boolean expression by substituting a false value for the user-defined clock net in the Boolean expression, and evaluating an expression that one of the positive and negative cofactors with respect to the user-defined clock net is a constant function and an other one of the positive and negative cofactors is a non-constant function, the expression corresponding to the cofactor condition.

The transforming of the gating circuit includes obtaining an enable net and reconnecting the user-defined clock net and the first input net. The obtaining of the enable net includes copying the gating circuit to a copy circuit, setting clock input of the copy circuit to one of a true and complement user-defined clock net, propagating the set clock input through the copy circuit, and setting the enable net as the gated clock net in the copy circuit. The reconnecting includes disconnecting the gated clock net from clock input of the sequential element and connecting the user-defined clock net to the clock input of the sequential element. The reconnecting includes additional operations depending on whether the sequential element has an enable input and whether there is an available library element that is functionally equivalent to the library element and has an enable input.

If the sequential element has an enable input, then the reconnecting further includes combining the enable net with an existing net connected to the enable input and connecting the combined net to the enable input. If the sequential element does not have the enable input and there is a library element which has a library enable input and is functionally equivalent to the sequential element, then reconnecting further includes replacing the sequential element with the library element, reconnecting output pin and equivalent inputs of the sequential element to the library element, connecting the enable net to the library enable input of the library element, and removing the sequential element. If the sequential element does not have an enable input and there is no equivalent element in the library, then the reconnecting further includes creating a selector circuit having a first input, a second input, a select input, and a selector output corresponding to the second input net. The selector circuit selects the first input when the select input is asserted and selects the second input when the select input is negated. Then, the reconnecting further includes disconnecting the first input net from the data input of the sequential element, connecting the first input net to the first input, connecting the output net to the second input, connecting the gated clock net to the select input of the selector circuit, and connecting the selector output to the data input of the sequential element.

Figure 3A:
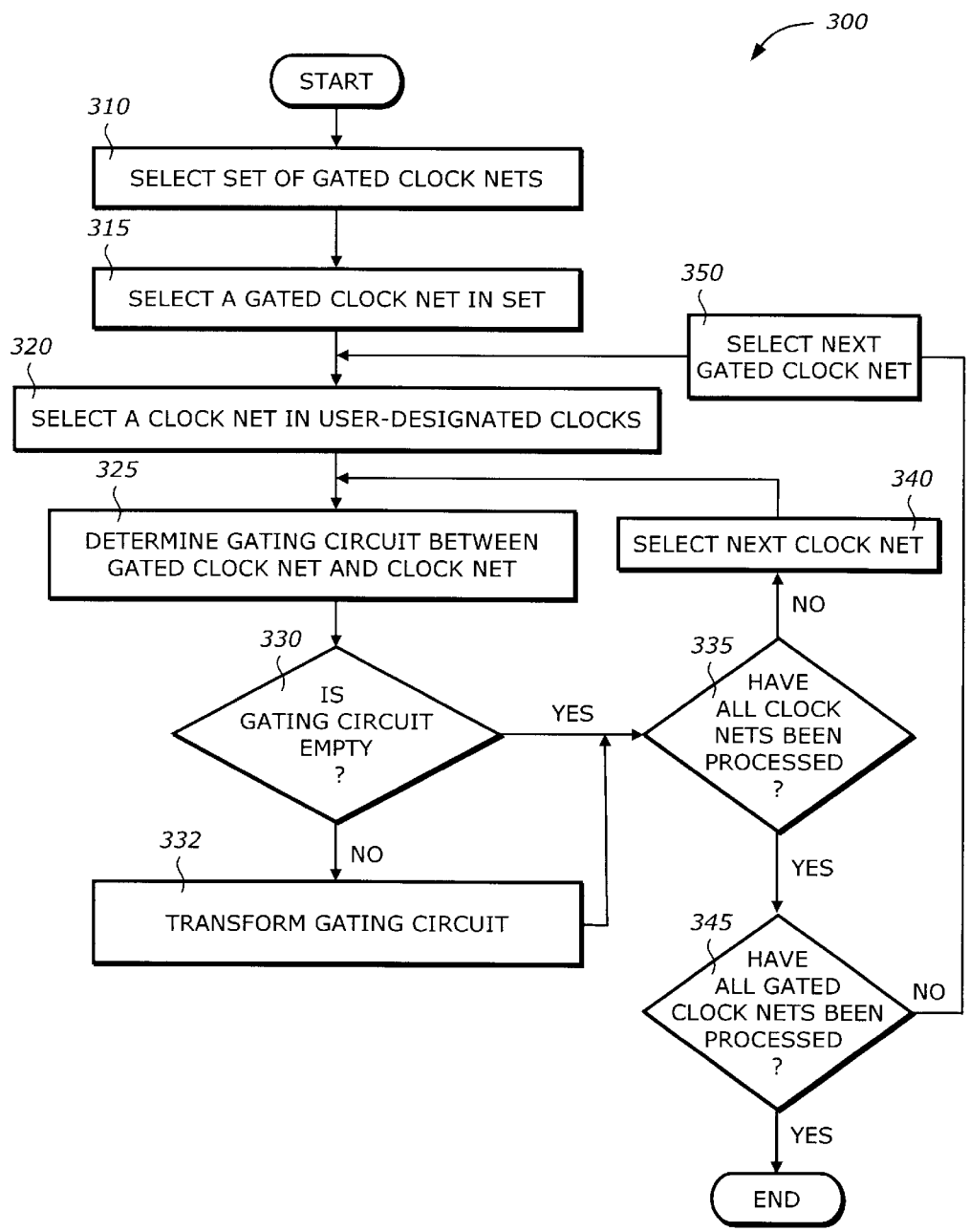
FIG. 3A is a flowchart illustrating a process to convert a gated clock circuit according to one embodiment of the present invention.

FIG. 3A is a flowchart illustrating a process 300 to convert a gated clock circuit according to one embodiment of the present invention. The process 300 implements the gated clock converter 266 shown in FIG. 2.

Upon START, the process 300 collects a set of all gated clock nets (Block 310). The gated clock nets are those nets that involve the gating of one or more clock signals used to clock one or more sequential elements. The sequential element may be a flip-flop, a register, a memory, a black box designated by the user as a sequential element, or any other clocked device. The sequential element receives a first input net and generates an output net at the assertion of the clock net. The triggering edge of the clock net may be positive-going or negative-going. The first input net is usually connected to the data input of the sequential element. The gated clock nets may be selected by the user or automatically by recognizing the existence of the relevant clock signals in the circuit. Then, the process 300 selects a gated clock net in the set of the gated clock nets that has not been processed (Block 315).

Figure 3B:
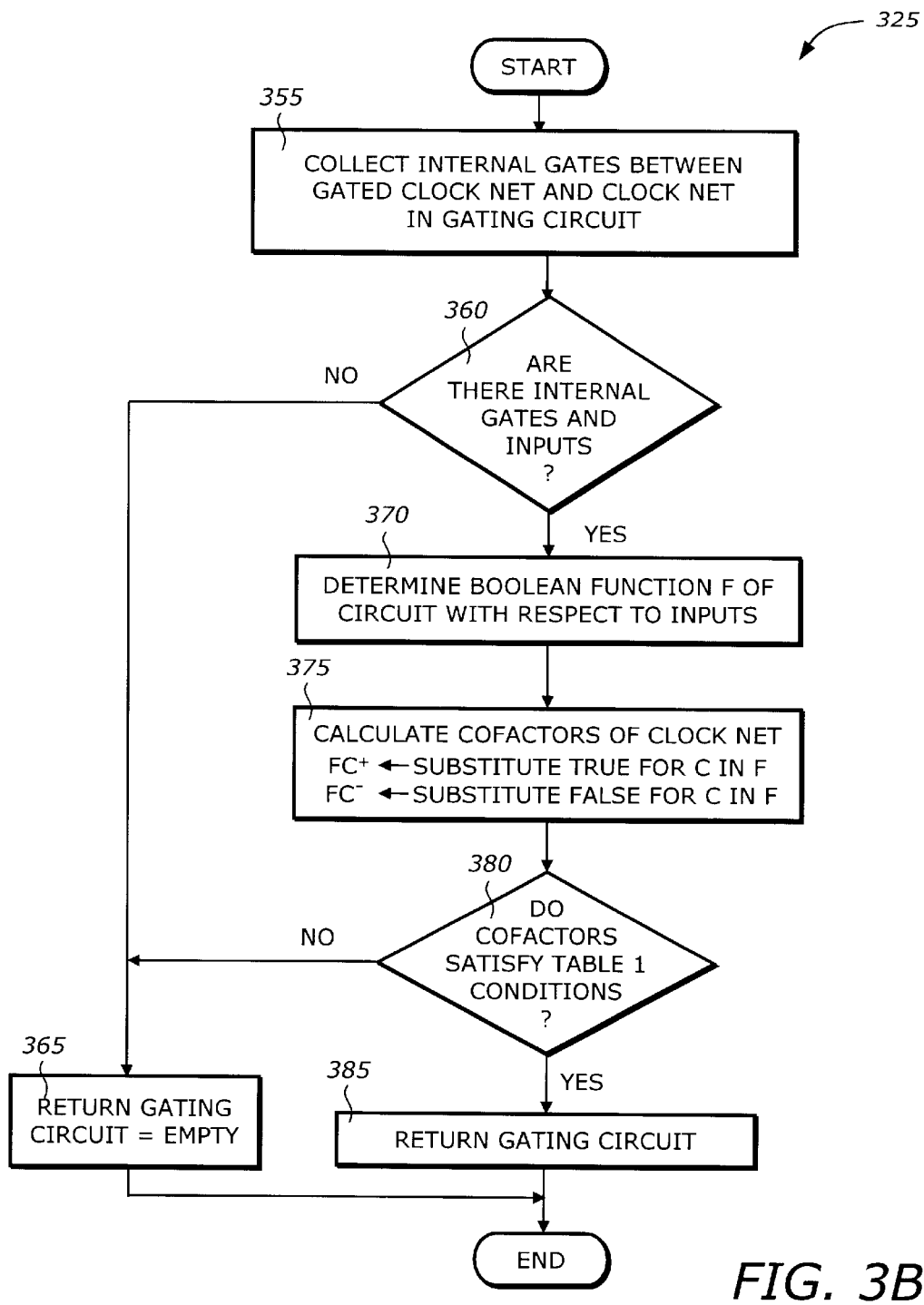
FIG. 3B is a flowchart illustrating a process to determine the gating circuit according to one embodiment of the present invention.
Figure 5:
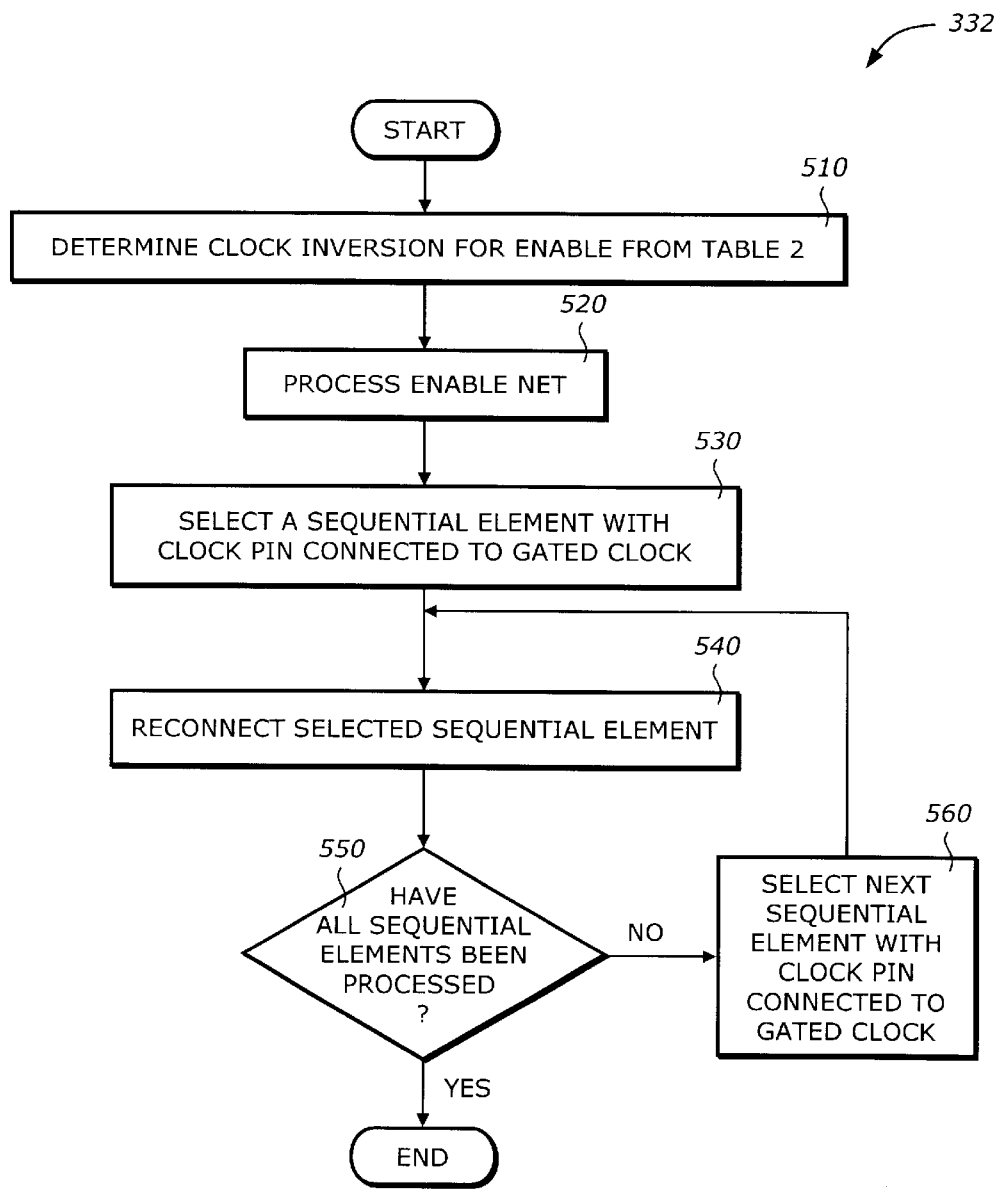
FIG. 5 is a flowchart illustrating a process to transform the gated clock net according to one embodiment of the present invention.

Next, the process 300 selects a user-defined clock net in the user-defined clocks (Block 320). Then, the process 300 determines a gating circuit between the gated clock net and the user-defined clock net (Block 325). The details of the process to determine the gating circuit are shown in FIG. 3B. Next, the process 300 determines if the gating circuit is empty (Block 330). As will be shown in FIG. 3B, the gating circuit is empty when there are no internal gates between the user-defined and gated clock nets or the cofactor condition is not satisfied. If the gating circuit is not empty, the process 300 transforms the gating circuit (Block 332). Details of the transformation are shown in FIG. 5. Then, the process 300 returns to Block 335. If the gating circuit is empty, the process 300 determines if all user-defined clock nets have been processed (Block 335). If not, the process 300 selects the next user-defined clock net (Block 340) and goes back to Block 325. If all user-defined clock nets have been processed, the process 300 determines if all gated clock nets have been processed (Block 345). If not, the process 300 selects the next gated clock net (Block 350) and goes to Block 320. If all gated clock nets have been processed, the process 300 is terminated.

FIG. 3B is a flowchart illustrating the process 325 to determine the gating circuit according to one embodiment of the present invention.

Upon START, the process 325 collects all internal gates, referred to as intermediate gates, between the gated clock net and the user-defined clock net and collects inputs in an input set (Block 355). These gates are on any path beginning at the user-defined clock net and ending at the gated clock net. The procedure to collect intermediate gates is described in details in FIG. 4. Then, the process 325 determines if there are any internal gates and inputs in the input set (Block 360). If not, the process 325 returns the gating circuit empty (Block 365) and is then terminated. Otherwise, the process 300 determines the Boolean function F of the circuit with respect to the inputs (Block 370). Then, the process 300 calculates the cofactors Fc+ and Fc− of the clock net (Block 375). The positive and negative cofactors Fc+ and Fc− are obtained by substituting TRUE and FALSE, respectively, for the clock net c in F. Next, the process 300 determines if these cofactors Fc+ and Fc− satisfy the conditions shown in Table 1 (Block 380). If not, the process 300 returns the gating circuit empty (Block 365) and is then terminated. Otherwise, the process 300 returns the gating circuit to be transformed (Block 385) and is then terminated.

Figure 4:
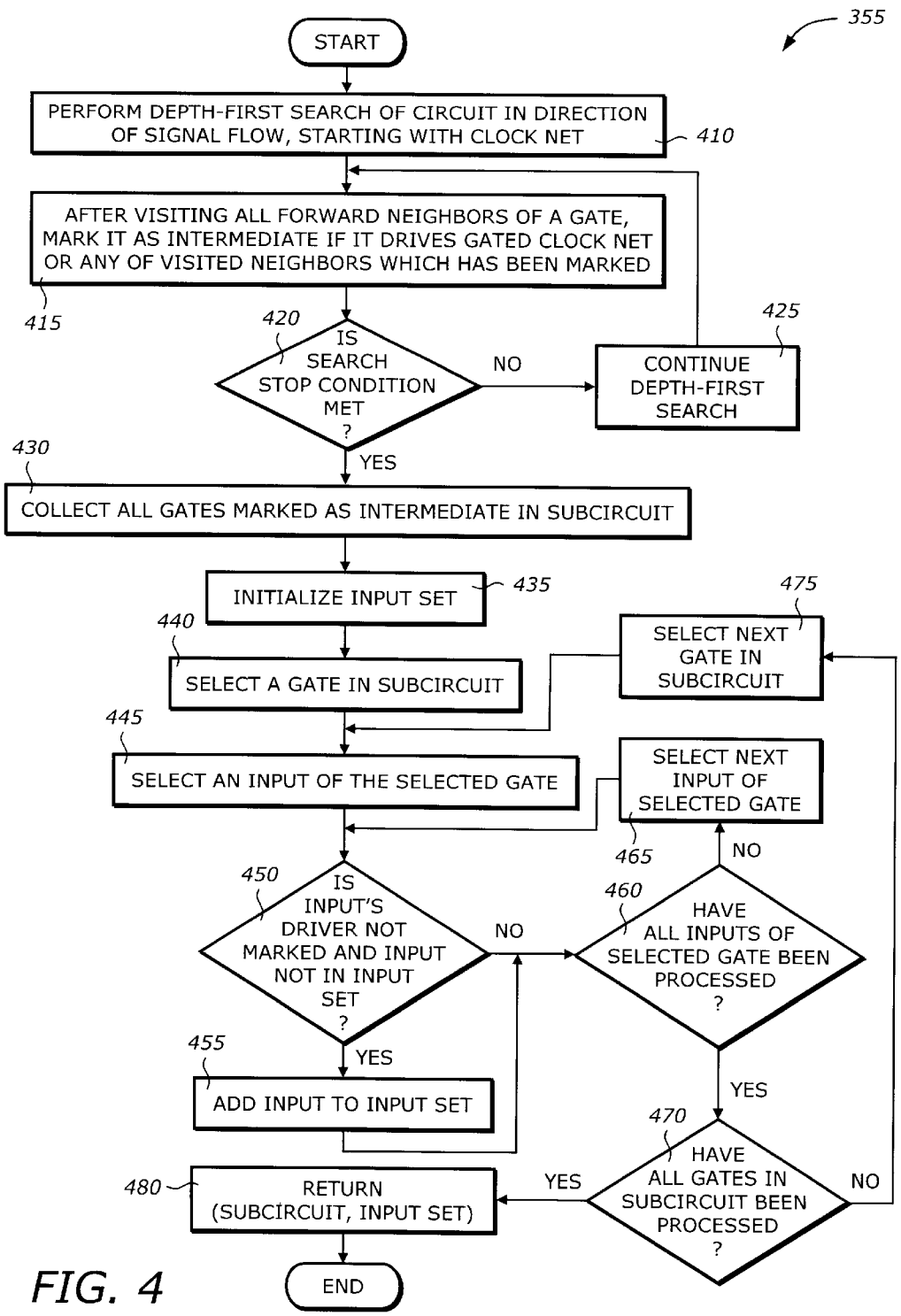
FIG. 4 is a flowchart illustrating a process to collect intermediate gates according to one embodiment of the invention.

FIG. 4 is a flowchart illustrating the process 355 to collect intermediate gates according to one embodiment of the invention.

Upon START, the process 355 performs a search of circuit in the direction of the signal flow (e.g., forward), starting with the user-defined clock net (Block 410). The search may be any suitable technique including depth-first and breadthfirst. In one embodiment, a depth-first search is used. Then, during search, after visiting all forward neighbors of a candidate gate in the search gates, the process 355 marks that candidate gate as intermediate if it drives the gated clock net or any of the visited neighbors which has been marked (Block 415). Next, the process 355 determines if the search stop condition is met (Block 420). The stop condition is met when the search reaches a primary input, the sequential element, or the gated clock net. If not, the process 355 continues the search (Block 425) and goes back to Block 415. Otherwise, the process 355 collects all gates marked as intermediate in a subcircuit (Block 430).

Then, the process 355 initializes the input set (Block 435). The input set is a set of inputs to the subcircuit. Note that a gate input to the subcircuit is a gate input driven by a gate outside the subcircuit, or equivalently is driven by a gate that is not marked as intermediate. Next, the process 355 selects a gate in the subcircuit (Block 440). Then, the process 355 selects an input of the selected gate (Block 445). Next, the process 355 determines if the driver of the selected input is marked intermediate and if the input is not already in the input set (Block 450). If so, the process 355 adds the selected input in the input set (Block 455) and goes to Block 460. Otherwise, the process 355 determines if all inputs of the selected gate have been processed (Block 460). If not, the process 355 selects the next input of the selected gate (Block 465) and goes to Block 450. Otherwise, the process 355 determines if all gates in the subcircuit have been processed (Block 470). If not, the process 355 selects the next gate in the subcircuit (Block 475) and goes to Block 445. Otherwise, the process 355 returns the contents of the subcircuit and the input set (Block 480) and is then terminated.

FIG. 5 is a flowchart illustrating the process 332 to transform the gated clock net according to one embodiment of the present invention.

Figure 6:
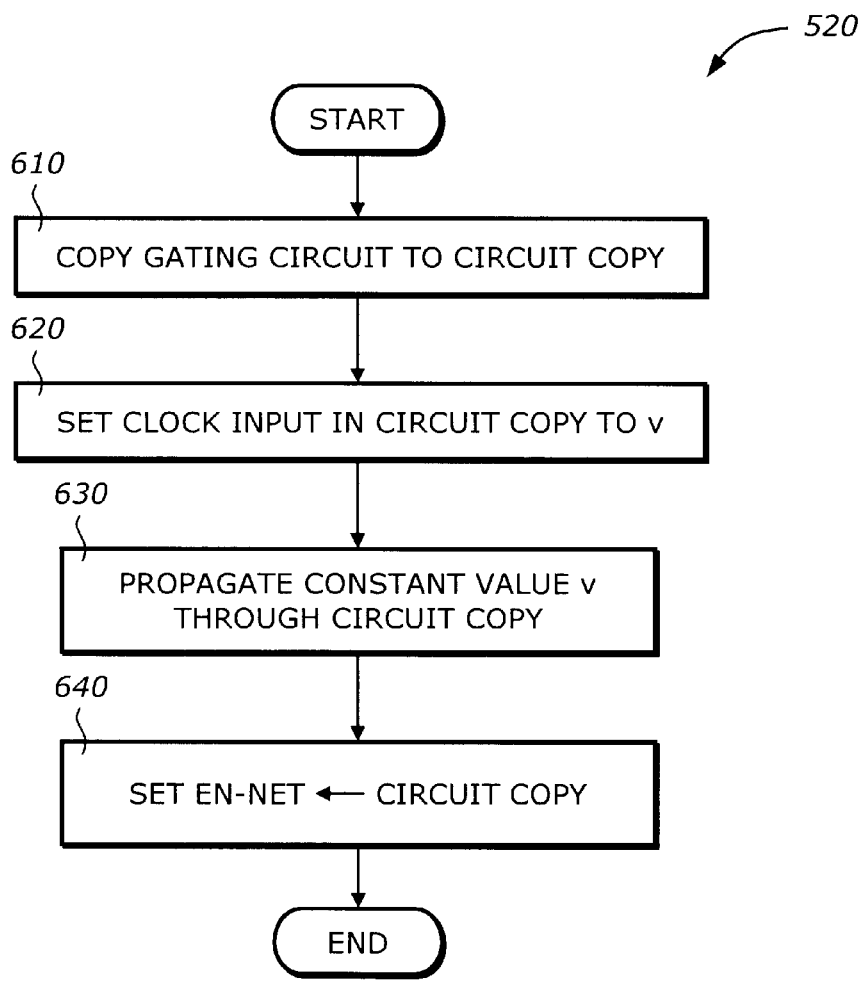
FIG. 6 is a flowchart illustrating a process to process the enable net according to one embodiment of the present invention.
Figure 7:
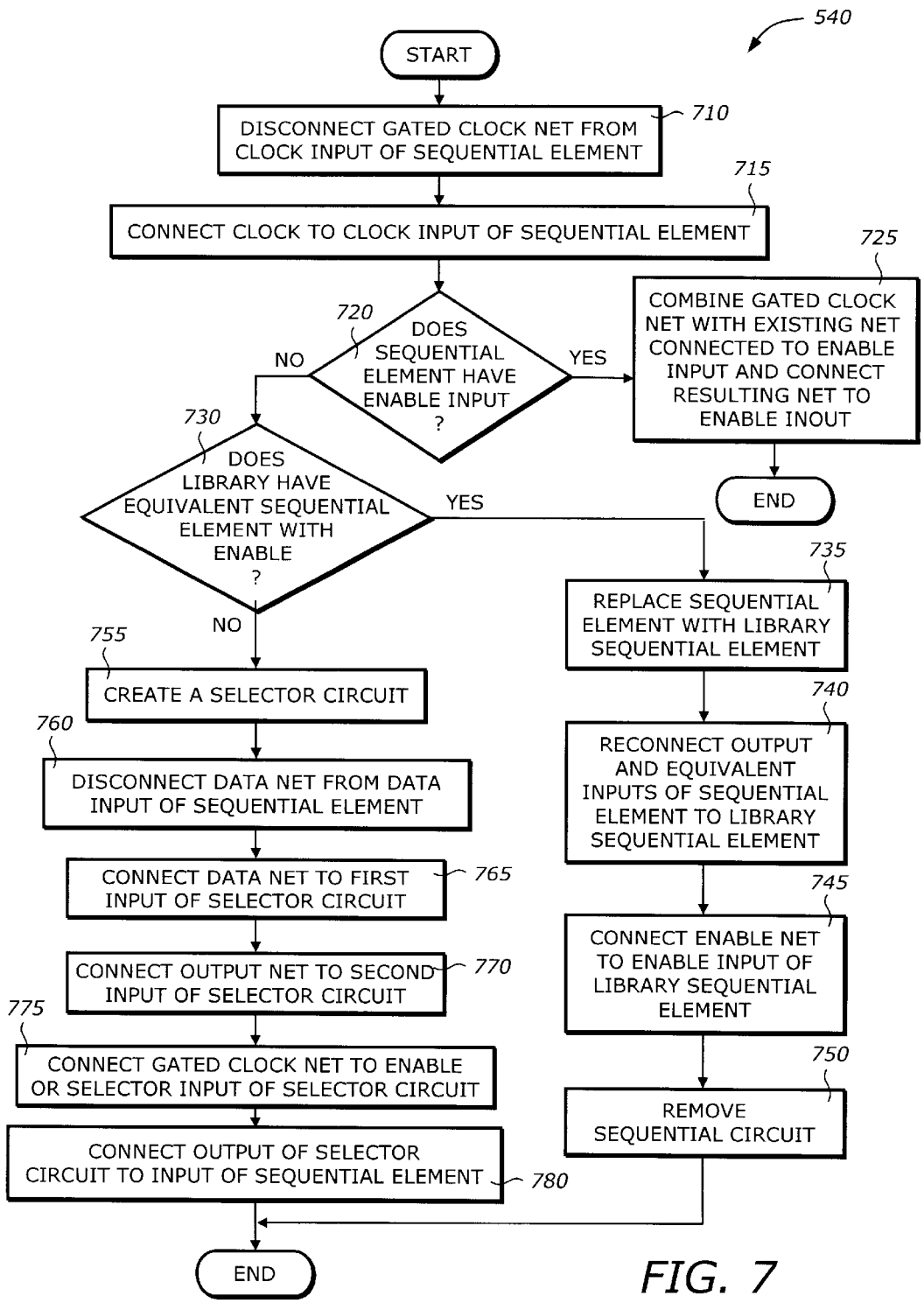
FIG. 7 is a flowchart illustrating a process to reconnect the transformed gating circuit to the sequential element according to one embodiment of the present invention.

Upon START, the process 332 determines v as the clock inversion for enable from Table 2 (Block 510). Next, the process 332 processes the enable net (Block 520). Details of the processing of the enable net are shown in FIG. 6. Then, the process 332 selects a sequential element which has a clock input connected to the gated clock net (Block 530). Next, the process 332 reconnects the selected sequential element (Block 540). Details of the reconnecting of the sequential element are shown in FIG. 7.

Then, the process 332 determines if all the sequential elements have been processed (Block 550). If not, the process 332 selects the next sequential element which has a clock input connected to the gated clock net (Block 560) and goes to Block 540. Otherwise, the process 332 is terminated.

FIG. 6 is a flowchart illustrating the process 520 to process the enable net according to one embodiment of the present invention.

Upon START, the process 520 copies the gating circuit to the circuit copy (Block 610). Then, the process 520 sets the clock input in the circuit copy to a variable v (Block 620). Next, the process 520 propagates the constant value v through the circuit copy (Block 630). Then, the process 520 returns the enable net (en-net) as the net in the circuit copy that corresponds to the gated clock net in the gating circuit (Block 640). The process 520 is then terminated.

FIG. 7 is a flowchart illustrating the process 540 to reconnect the transformed gating circuit to the sequential element according to one embodiment of the present invention.

Upon START, the process 540 disconnects the gated clock net from the clock input of the sequential element (Block 710). Then the process 540 connects the clock net or clock signal to the clock input of the sequential element (Block 715). Next, the process 540 determines if the sequential element has an enable input (Block 720). If so, the process 540 connects the gated clock net to the enable input of the sequential element or combines with an existing enable net from another gate (e.g., ANDing with another enable net) and connecting the resulting net to the enable input (Block 725) and is then terminated. Otherwise, the process 540 determines if the technology library has a functionally equivalent sequential element with enable input (Block 730). If so, the process 540 replaces the sequential element with the library sequential element (Block 735). Then, the process 540 reconnects the output and the equivalent inputs of the sequential element to the library sequential element (Block 740). Next, the process 540 connects the enable net obtained in Block 520 of FIG. 5 to the enable input of the library sequential element (Block 745). Then, the process 540 removes the sequential element (Block 750) and is then terminated.

If the sequential element does not have an enable input and the technology library does not have a functionally equivalent sequential element with an enable input, the process 540 creates a selector circuit (Block 755). The selector circuit is a circuit that has first and second inputs, a select input and an output. The first input is selected to become the output when the select input is at a first logic level (e.g., true). The second input is selected to become the output when the select input is at a second logic level (e.g., false). An example of such a selector circuit is a: two-to-one multiplexer or data selector. Then, the process 540 disconnects the data net from the data input of the sequential element (Block 760). The term "sequential element" here refers to the original sequential element or the library sequential element as appropriate. Next, the process 540 connects the data net to the first input of the selector circuit (Block 765). Then, the process 540 connects the output net of the sequential element to the second input of the selector circuit (Block 770). Next, the process 540 connects the gated clock net to the enable or selector input of the selector circuit (Block 775). Then, the process 540 connects the output of the selector circuit to the input of the sequential element (Block 780) and is then terminated.

The gated clock conversion may also be described by the following pseudo-codes.

```
main procedure GatedClockConversion( )
/* a gated clock net is a net connected to the clock input of a sequential element */
    collect gated-block nets (gc-net);
    for (each gc-net in collected gated-clock nets) do
        for (each c-net in user-defined clocks) do
            gating-circuit = DetermineGatingCircuit(c-net, gc-net);
```

```
            if gating-circuit is not empty then
                Transform(gating-circuit, seq-elem, gc-net, c-net);
            end if
        end for
    end for
end main procedure
procedure DetermineGatingCircuit(c-net, gc-net)
    /* collect gates between gc-net and c-net */
    (gating-circuit, input-set) = CollectInterGatesAndInputs (c-net, gc-net);
    if (gating-circuit and input-sec are not empty) then
        Determine Boolean function F of gating-circuit with respect to inputs in input-set;
        (Fc+, Fc-) = CalculateCofactors(F, c-net);
        if (Fc+ and F- satisfy conditions in table 1) then
            return gating-circuit;
        else
            return empty circuit;
        end if
    else
        return empty circuit;
    end if
end procedure
procedure CollectInterGatesAndInputs(c-net, gc-net)
/* mark all gates on all paths from c-net to gc-net */
    perform forward (in the direction of signal flow) search of
        circuit starting with c-net;
    during search, after visiting all forward neighbors of a gate (gates driven by that
        gate), mark the gate as intermediate if it drives gc-net or any of the visited
        neighbors which has been marked;
    search stops at primary inputs, sequential elements, and gc-net;
    subcircuit = collection of all gates marked as intermediate;
    input-set = empty set;
    for (each gate in subcircuit) do
        for (each input of gate) do
            if (input's driver is not marked and input is not in input-set) then
                add input to input-set;
            end if
        end for
    end for
    return (subcircuit, input-set);
end procedure
procedure CalculateCofactors(F,C)
    obtain Fc+ by substituting true for C in F;
    obtain Fc- by substituting false for C in F;
    return (Fc+, Fc-)
end procedure
procedure Transform(gating-circuit, seq-elem, gc-net, c-net)
    v = clock inversion for enable from table 2;
    en-net = EnableCircuit(gating-circuit, c-net, v);
    for (each seq-elem with clock pin connected to gc-net) do
        Reconnect(seq-elem, gc-net, c-net, en-net);
    end for
end procedure
procedure EnableCircuit(gating-circuit, clock-input, val)
    circuit copy = copy gating-circuit;
    set clock-input in circuit-copy to val;
    propagate constant val through circuit-copy;
    en-net = net in circuit-copy that corresponds to gated-clock net in gating-circuit;
    return en-net
end procedure
procedure Reconnect(seq-element, gc-net, c-net, en-net)
    disconnect gc-net from clock pin of seq-element;
    connect c-net to clock pin of seq-element;
    if (seq-element has enable input) then
        combine en-net with existing net connected to enable input of
            seq-element and connect resulting net to enable input of seq-element;
    else if (library has lib-seq-element with enable and functionally
            equivalent to seq-element) then
        replace seq-element with lib-seq-element;
        reconnect output pin and equivalent inputs of seq-element with
            lib-seq-element;
        connect en-net to enable input of lib-seq-element;
        remove seq-element for the circuit;
    else
        create mux gate;
        disconnect data net from data input pin of seq-element;
        connect data net to input "1" of mux gate;
        output net = net connected to output pin of seq-element;
        connect output net to the input "0" of mux gate;
        connect gc-net to the enable pin of mux gate;
```

```
    create new net;
    connect new net to output pin of mux gate;
    connect new net to data input pin of seq-element;
  end if
end procedure
```

Figure 8:
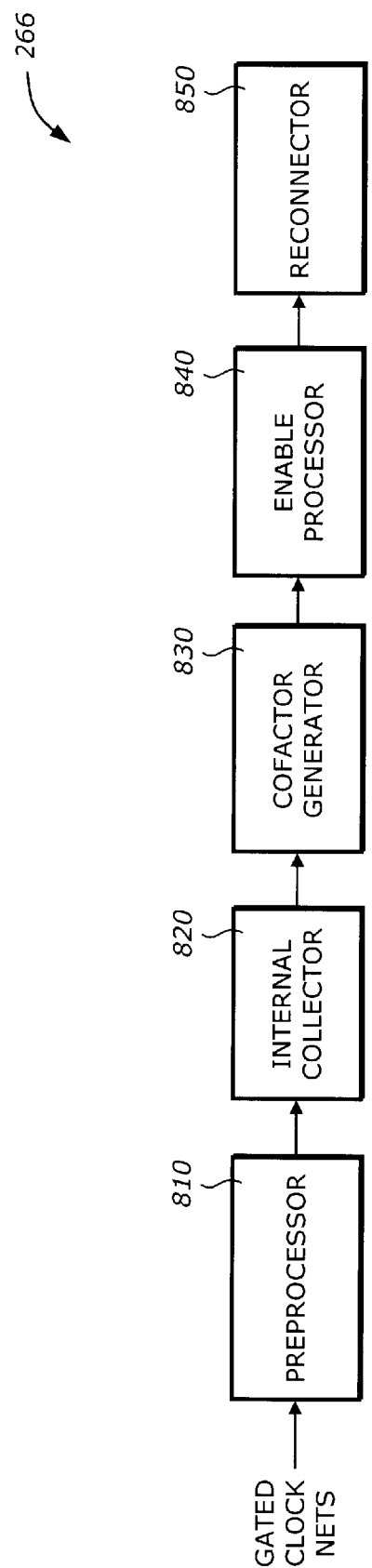
FIG. 8 is a diagram illustrating a gated clock converter shown in FIG. 2 according to one embodiment of the present invention.

FIG. 8 is a diagram illustrating a gated clock converter 266 shown in FIG. 2 according to one embodiment of the present invention. The gated clock converter 266 includes a pre-processor 810, an internal collector 820, a cofactor generator 830, an enable processor 840, and a re-connector 850. The internal collector 820 and the cofactor generator 830 corresponds to determine the gating circuit shown as Block 325 (FIG. 3A). The enable processor 840 and the re-connector 850 corresponds to transform the gating circuit shown as Block 332 (FIG. 3A). Each of the blocks in the gated clock converter 266 may be implemented by hardware, software, firmware, or any combination thereof.

The pre-processor 810 pre-processes the gated clock nets in the circuit. This includes the following tasks: collecting all the gated clock nets in the circuit in a set, selecting a gated clock net in the set, and selecting a clock net in user-defined clocks for processing. In essence, the pre-processor 810 performs the tasks shown in blocks 310, 315 and 320 in FIG. 3.

The internal collector 820 collects the internal or intermediate gates between the gated clock net and the user-defined clock net. In essence, the internal collector 820 performs the tasks in the process 355 as described in FIG. 4.

The cofactor generator 830 performs the following tasks: determining the Boolean function of the circuit, calculating the positive and negative cofactors Fc+ and Fc− of the Boolean function F, and determining if the cofactors satisfy one of the four cofactor conditions in the Table 1. In essence, the cofactor generator 830 performs the tasks shown in Blocks 370, 375, and 380 in FIG. 3B.

The enable processor 840 performs the following tasks: copying the gating circuit to the circuit copy, setting the clock input to variable v, propagating the constant value v through the circuit copy, and returning the enable net as the net in the circuit copy that corresponds to the gated clock net in the gating circuit. In essence, the enable processor 840 performs the tasks 616, 620, 630, and 640 of the process 520 shown in FIG. 6.

The re-connector 85( ) re-connects the transformed gating circuit to the sequential element for all the instances in the sequential elements or black boxes with clock pin connected to the gated clock net. The re-connector 850 essentially performs the tasks of the process 540 as shown in FIG. 7.

FIG. 9A is a diagram illustrating an example of a circuit 900 with an gating circuit using multiple-input AND gate according to one embodiment of the invention. The circuit 900 includes a gating circuit 910 and a sequential element 920.

The gating circuit 910 drives the clock input of the sequential element 920 and includes a three-input AND gate 912. The AND gate 912 is the driver gate having its output connected to the clock input of the sequential element 920 via the gated clock net 925. The AND gate 912 has two inputs connected to two enable signals en1 and en2. The third input is connected to the clock signal clk.

The sequential element 920 is a D flip-flop. The sequential element 920 receives a first input signal data at its data input D and generates an output signal out.

Figure 9B:
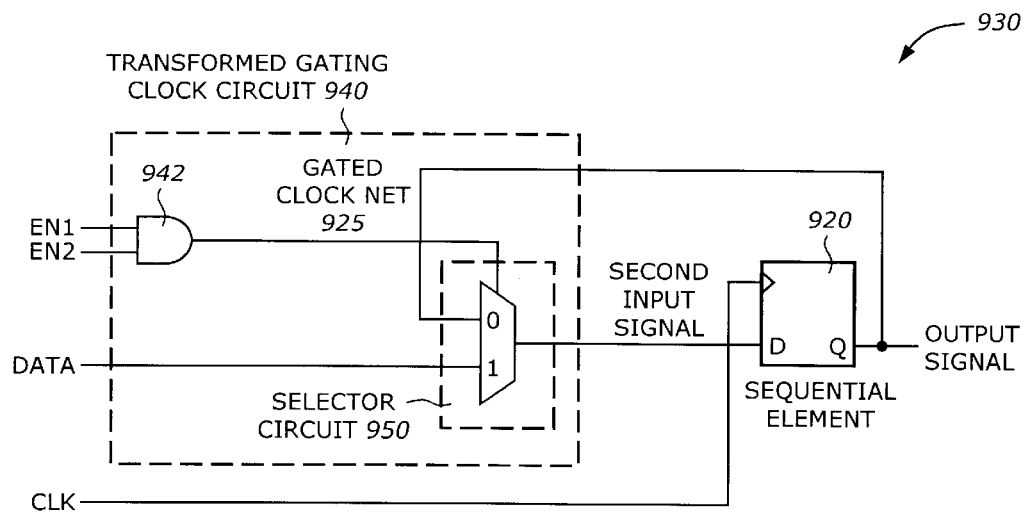
FIG. 9B is a diagram illustrating an example of a circuit with the gating circuit using AND gate after transformation according to one embodiment of the invention.

FIG. 9B is a diagram illustrating an example of a circuit 930 with the gating circuit using AND gate after transformation according to one embodiment of the invention. The circuit 930 includes a transformed gating circuit 940 and the sequential element 920.

The transformed gating circuit 940 includes an enable circuit 942 and a selector circuit 950. The enable circuit 942 is a two-input AND gate. The AND gate 942 receives the two en1 and en2 signals as inputs and generates the gated clock net 925 which becomes an enable or selector signal to the select input of the selector circuit 950.

The selector circuit 950 is coupled to the sequential element 920 to generate a second input signal to the sequential element from the data signal and the output signal based on the selector signal at the selector input. The sequential element 920 generates the output signal from the input signal according to the clock signal connected to the clock input of the sequential element 920. In one embodiment, the selector circuit 950 is a two-input multiplexer.

The circuit 930 is generated as a result of a gated clock conversion of the circuit 900. In accordance to the transformation, the gated clock net 925 is disconnected from the clock input of the sequential element 920 and the clock signal clk is connected to the clock input of the sequential element 920. Since the sequential element 920 does not have an enable input, the gated clock net 925 is connected to the enable or select input of the selector circuit 950. The selector circuit 950 has first and second selector inputs. The selector circuit 950 provides a second input signal to the sequential element 920 at its D input according to the select input. The output of the sequential element 920, out signal, is then connected to the first selector input. The first input signal, or the data signal, is then connected to the second selector input. In one embodiment, the selector circuit 950 is a two-input multiplexer. The multiplexer 950 selects the first selector input as the second input signal at its output when the select input is at a first logic level (e.g., LOW). The multiplexer 950 selects the second selector input as the second input signal at its output when the select control input is at a second logic level (e.g., HIGH).

The enable signals en1 and en2 are active TRUE enable signals, i.e., when they are TRUE, the clock signal is enabled to clock the data signal in the original circuit 900 in FIG. 9A. When one of them is FALSE, the clock signal is disabled. As shown in FIG. 9B, when the en1 and en2 are TRUE, the select input is at the HIGH logic level, selecting the data signal to the data input of the sequential element 920. When at least one of the enable signals en1 and en2 is FALSE, the select input is at the LOW logic level, selecting the output signal out as the data input to the sequential element 920. In this case, the sequential element 920 continues to clock in the same data as its output and therefore retains the same previously loaded data.

FIG. 10A is a diagram illustrating an example of a circuit 1000 with an AND-OR tree according to one embodiment of the invention. The circuit 1000 includes a gating circuit 1010 and a sequential element 1020.

The gating circuit 1010 drives the clock input of the sequential element 1020 and includes an OR gate 1012 and two AND gates 1014 and 1016. The OR gate 1012 is the driver gate having its output connected to the clock input of the sequential element 1020 via the gated clock net 1025. The OR gate 1012 has two inputs connected to the outputs of the two AND gates 1014 and 1016. The AND gate 1014 has two inputs connected to an enable signal en1 and the clock signal clk. The AND gate 1016 has two inputs: one is connected to the clk signal and the other is connected to an enable signal en2. The clk signal therefore is gated by either en1 or en2.

The sequential element 1020 is a D flip-flop. The sequential element 1020 receives a first input signal data at its D input and generates an output signal out at the positive-going transition at the clock input. Alternatively, the sequential element 1020 may be negative-edge triggered and the driver gate 1012 is a NOR gate, or an OR gate followed by an inverter.

FIG. 10B is a diagram illustrating an example of a circuit 1030 with an AND-OR tree after transformation according to one embodiment of the invention. The circuit 1030 includes a transformed gated clock circuit 1040 and the sequential element 1020.

The transformed gating circuit 1040 includes an enable circuit 1042 and a selector circuit 1050. The enable circuit 1042 includes an OR gate. The OR gate 1042 has two inputs connected to the en1 and en2 signals. The OR gate 1042 combines these enable signals to form a selector signal to the select control input of the selector circuit 1050.

The selector circuit 1050 is coupled to the sequential element 1020 to generate an input signal to the sequential element 1020 from a data signal and an output signal based on the selector signal. The sequential element 1020 generates the output signal from the input signal according to a clock signal connected to the clock input of the sequential element 1020. In one embodiment, the selector circuit 1050 is a two-input multiplexer.

The circuit 1030 is generated as a result of a gated clock conversion of the circuit 1000 shown in FIG. 10A. In accordance to the transformation, the AND gate 1014 in FIG. 10A is identified as having the clock signal as a gate input. The clock signal clk is removed from the AND gate 1014. The gated clock net 1025 is disconnected from the clock input of the sequential element and the clock signal clk is connected to the clock input of the sequential element 1020. Since the sequential element 1020 does not have an enable input, the gated clock net 1025 is connected to an enable or select input of the selector circuit 1050. The selector circuit 1050 operates in a similar manner as the selector 950 shown in FIG. 9B.

The transformation and reconnecting operations not only reduce the clock skew due to long delay caused by the enable gates, they also improve the margin for delay variations. Typically, in traditional gated clock circuits, the associated control signal transitions are restricted to occurring only during the second half of the clock period to prevent a noisy control signal transition from causing an inadvertent state change of the sequential element. This restriction creates a very narrow window for signal transition. In many cases, this window is even made narrower to allow extra safety margin against gate delay variation due to process, temperature, and other variations.

Figure 11A:
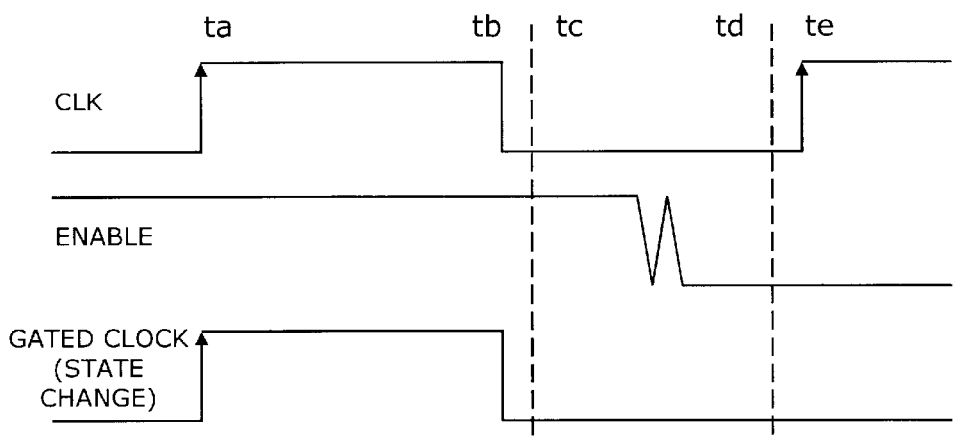
FIG. 11A is a diagram illustrating disabling an AND gated clock in a traditional gated clock circuit.

FIG. 11A is a diagram illustrating disabling an AND gated clock in a traditional gated clock circuit.

The clock signal has a HIGH period from ta and tb and a LOW period from tb to te. The clock signal is disabled by bringing the enable signal LOW at the second half of the clock period. If the enable signal is brought LOW at the first half of the clock period, the resulting gated clock signal may have a narrow HIGH pulse starting at ta which may violate the pulse width requirement. The signal transition takes place within the window defined by the tc and td which is narrower than the LOW period.

Figure 11B:
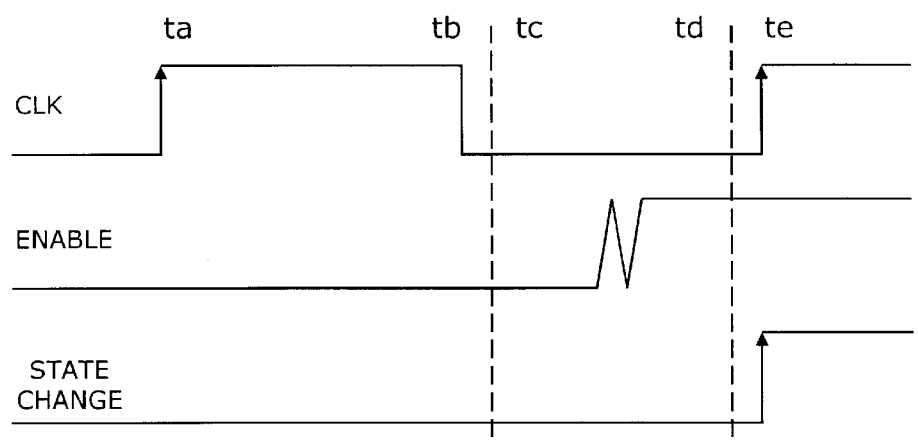
FIG. 11B is a diagram illustrating enabling an AND gated clock in a traditional gated clock circuit.

FIG. 11B is a diagram illustrating enabling an AND gated clock in a traditional gated clock circuit.

The clock signal is enabled by bringing the enable signal HIGH at the second half of the clock period. If the enable signal is brought HIGH in the first half of the clock period, the resulting gated clock signal may have a premature HIGH spike terminated at tb which may cause erroneous data clocking. The signal transition takes place within the window defined by tc and td which is narrower than the LOW period.

Figure 11C:
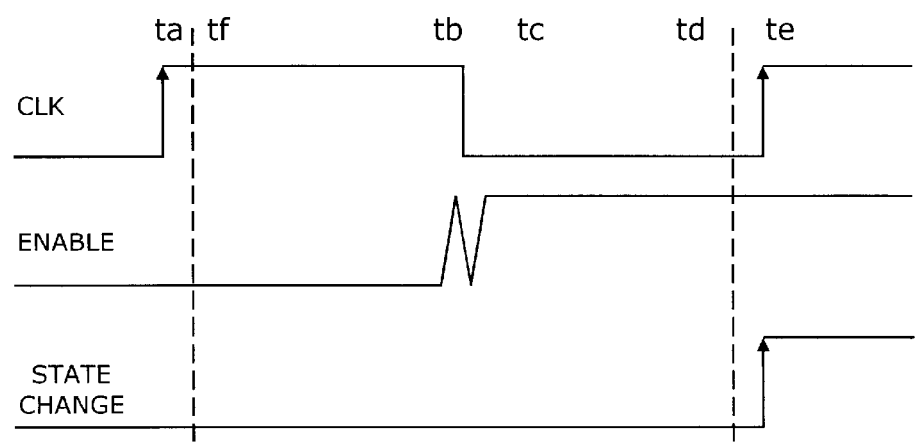
FIG. 11C is a diagram illustrating enabling an AND gated clock after conversion according to one embodiment of the invention.

FIG. 11C is a diagram illustrating enabling an AND gated clock after conversion according to one embodiment of the invention.

The enable signal can be activated within a much wider window defined by tf and td, allowing more tolerant for delay variations caused by process, temperature, and other variations. This is because the clock signal now drives the clock input of the sequential element directly without going through a chain of enable gates. In addition, the enable signal is now used only to select the data input from the selector circuit, or the multiplexer. There is only one delay caused by the delay from the select control input to the output of the selector circuit. This delay timing can be used to define the tf and td window.

The embodiments in the present invention provide a number of advantages. First, the clock skew is reduced, providing more constant clock delays in various sequential elements. Second, the gated clock circuit can be simplified, eliminating a number of enable gates. Third, the operational window of the enable signal is wider, providing more tolerance for delay variations caused by process, temperature, and other variations. While the prior art traverses only the tree of AND gates with an inverter at the output of the root AND gate, effectively being a NAND gate, as driving circuits, the described solution traverses driving circuits of any acyclic structure. To accommodate more generic driving circuits, the described solution determines the function calculated by the circuit and checks the function for the conditions in Table 1 regardless of the concrete implementation (structure) of the circuit. While the prior art only accommodates the tree of AND gates and an inverter at the output of the root AND gate, the described solution accommodates the circuit regardless of the type of the individual gates and of the structure as long as the structure is acyclic which is more general than the tree. This enhanced capability is achieved by checking the function of the entire driving circuit, and not just the individual gates. While the prior solution is limited to the technology library primitives, the described solution accommodates both technology library primitives and user-designated black boxes.

While this invention has been described with reference to illustrative embodiments, this description is not intended to be construed in a limiting sense. Various modifications of the illustrative embodiments, as well as other embodiments of the invention, which are apparent to persons skilled in the art to which the invention pertains are deemed to lie within the spirit and scope of the invention.

What is claimed is:

1. A method comprising:

determining a sating circuit having a Rated clock net that drives a clock input of a sequential element, the sequential element receiving a first input net at a data input and generating an output net, the gating circuit having a user-defined clock net, determining the gating circuit comprising:

collecting internal gates between the sated clock net and the user-defined clock net, collecting the internal gates comprising:

collecting intermediate gates in a subcircuit of the gating circuit, initializing an input set, selecting an input of one of the intermediate gates, the input having a driver, and adding the input to the input set if the driver is not marked and the input is not in the input set; and generating cofactors of a Boolean function of the gating circuit; and transforming the gating circuit to provide a second input net to the sequential element based on a cofactor condition of the gating circuit, wherein collecting the intermediate gates comprises:

performing a search of gates in the gating circuit starting from the user-defined clock net;

marking a candidate gate in the gates as an intermediate gate if the candidate gate drives one of the gated clock nets and a neighboring gate that has been marked after visiting all forward neighbors of the candidate gate; and stopping the search when one of a primary input, the sequential element, and the gated clock net is reached.

2. The method of claim 1 wherein generating the cofactors comprises:

determining a Boolean function of the gating circuit with respect to the user-defined clock net;

obtaining a positive cofactor of the Boolean expression by substituting a true value for the user-defined clock net in the Boolean expression;

obtaining a negative cofactor of the Boolean expression by substituting a false value for the user-defined clock net in the Boolean expression; and evaluating an expression that one of the positive and negative cofactors with respect to the user-defined clock net is a constant function and an other one of the positive and negative cofactors is a non-constant function, the expression corresponding to the cofactor condition.

3. A method comprising:

determining a gating circuit having a gated clock net that drives a clock input of a sequential element, the sequential element receiving a first input net at a data input and generating an output net, the gating circuit having a user-defined clock net; and transforming the gating circuit to provide a second input net to the sequential element based on a cofactor condition of the gating circuit, transforming comprising:

obtaining an enable net, and reconnecting the user-defined clock net and the first input net, wherein reconnecting comprises:

disconnecting the gated clock net from clock input of the sequential element, connecting the user-defined clock net to the clock input of the sequential element, if the sequential element has an enable input, combining the enable net with an existing net connected to the enable input, the combined enable net and the existing net being connected to the enable input, and if the sequential element does not have the enable input and there is a library element having a library enable input and functionally equivalent to the sequential element, replacing the sequential element with the library element, reconnecting output pin and equivalent inputs of the sequential element to the library element, connecting the enable net to the library enable input of the library element, and removing the sequential element.

4. The method of claim 3 wherein obtaining the enable net comprises:

copying the gating circuit to a copy circuit;

setting clock input of the copy circuit to one of a true and complement user-defined clock net;

propagating the set clock input through the copy circuit; and setting the enable net as the gated clock net in the copy circuit.

5. The method of claim 3 wherein reconnecting further comprises:

if the sequential element does not have an enable input and there is no equivalent element in the library, creating a selector circuit having a first input, a second input, a select input, and a selector output corresponding to the second input net, the selector circuit selecting the first input when the select input is asserted and selecting the second input when the select input is negated;

disconnecting the first input net from the data input of the sequential element;

connecting the first input net to the first input;

connecting the output net to the second input;

connecting the gated clock net to the select input of the selector circuit; and connecting the selector output to the data input of the sequential element.

6. A computer program product of comprising:

a machine useable medium having program code embedded therein, the program code comprising:

computer readable program code to determine a gating circuit having a gated clock net that drives a clock input of a sequential element, the sequential element receiving a first input net at a data input and generating an output net, the gating circuit having a user-defined clock net, the computer readable program code to determine the gating circuit comprising:

computer readable program code to collect internal gates between the gated clock net and the user-defined clock net, the computer readable program code to collect the internal gates comprising:

computer readable program code to collect intermediate gates in a subcircuit of the gating circuit, computer readable program code to initialize an input set, computer readable program code to select an input of one of the intermediate gates, the input having a driver, and computer readable program code to add the input to the input set if the driver is not marked and the input is not in the input set, and computer readable program code to generate cofactors of a Boolean function of the gating circuit; and computer readable program code to transform the eating circuit to provide a second input net to the sequential element based a cofactor condition of the gating circuit, wherein the computer readable program code to collect the intermediate gates comprises:

computer readable program code to perform a search of gates in the gating circuit starting from the user-defined clock net;

computer readable program code to mark a candidate gate in the gates as an intermediate gate if the candidate gate drives one of the gated clock net and a neighboring gate that has been marked after visiting all forward neighbors of the candidate gate; and computer readable program code to stop the search when one of a primary input, the sequential element, and the gated clock net is reached.

7. The computer program product of claim 6 wherein the computer readable program code to generate the cofactors comprises:

computer readable program code to determine a Boolean function of the gating circuit with respect to the user-defined clock net;

computer readable program code to obtain a positive cofactor of the Boolean expression by substituting a true value for the user-defined clock net in the Boolean expression;

computer readable program code to obtain a negative cofactor of the Boolean expression by substituting a false value for the user-defined clock net in the Boolean expression; and computer readable program code to evaluate an expression that one of the positive and negative cofactors with respect to the user-defined clock net is a constant function and an other one of the positive and negative cofactors is a non-constant function, the expression corresponding to the cofactor condition.

8. A computer program product comprising:

a machine useable medium having program code embedded therein, the program code comprising:

computer readable program code to determine a gating circuit having a gated clock net that drives a clock input of a sequential element, the sequential element receiving a first input net at a data input and generating an output net, the gating circuit having a user-defined clock net; and computer readable program code to transform the gating circuit to provide a second input net to the sequential element based a cofactor condition of the gating circuit, the computer readable program code to transform comprising:

computer readable program code to obtain an enable net, and computer readable program code to reconnect the user-defined clock net and the first input net;

wherein the computer readable program code to reconnect comprises:

computer readable program code to disconnect the gated clock net from clock input of the sequential element, computer readable program code to connect the user-defined clock net to the clock input of the sequential element, computer readable program code to combine the enable net with an existing net connected to the enable input if the sequential element has an enable input, the combined enable net and the existing net being connected to the enable input, and computer readable program code to replace the sequential element with a library element if the sequential element does not have the enable input and there is the library element having a library enable input and functionally equivalent to the sequential element, computer readable program code to reconnect output pin and equivalent inputs of the sequential element to the library element, computer readable program code to connect the enable net to the library enable input of the library element, and computer readable program code to remove the sequential element.

9. The computer program product of claim 8 wherein the computer readable program code to obtain the enable net comprises:

computer readable program code to copy the gating circuit to a copy circuit;

computer readable program code to set clock input of the copy circuit to one of a true and complement user-defined clock net;

computer readable program code to propagate the set clock input through the copy circuit; and computer readable program code to set the enable net as the gated clock net in the copy circuit.

10. The computer program product of claim 8 wherein the computer readable program code to reconnect further comprises:

computer readable program code to create a selector circuit if the sequential element does not have an enable input and there is no equivalent element in the library, the selector circuit having a first input, a second input, a select input, and a selector output corresponding to the second input net, the selector circuit selecting the first input when the select input is asserted and selecting the second input when the select input is negated;

computer readable program code to disconnect the first input net from the data input of the sequential element;

computer readable program code to connect the first input net to the first input;

computer readable program code to connect the output net to the second input;

computer readable program code to connect the gated clock net to the select input of the selector circuit; and computer readable program code to connect the selector output to the data input of the sequential element.

11. A system comprising:

a processor; and a memory coupled to the processor, the memory having program code, the program code when executed by the processor causing the processor to:

determine a gating circuit having a gated clock net that drives a clock input of a sequential element, the sequential element receiving a first input net at a data input and generating an output net, the gating circuit having a user-defined clock net, the program code causing the processor to determine the gating circuit causes the processor to:

collect internal gates between the gated clock net and the user-defined clock net, the program code causing the processor to collect the internal gates causes the processor to:

collect intermediate gates in a subcircuit of the gating circuit, initialize an input set;

select an input of one of the intermediate gates, the input having a driver, and add the input to the input set if the driver is not marked and the input is not in the input set, and generate cofactors of a Boolean function of the gating circuit; and transform the gating circuit to provide a second input net to the sequential element based on a cofactor condition of the gating circuit;

wherein the program code causing the processor to collect the intermediate gates causes the processor to:

perform a search of gates in the gating circuit starting from the user-defined clock net;

mark a candidate gate in the gates as an intermediate gate if the candidate gate drives one of the gated clock net and a neighboring gate that has been marked after visiting all forward neighbors of the candidate gate; and stop the search when one of a primary input, the sequential element, and the gated clock net is reached.

12. The system of claim 11 wherein the program code causing the processor to generate the cofactors causes the processor to:

determine a Boolean function of the gating circuit with respect to the user-defined clock net;

obtain a positive cofactor of the Boolean expression by substituting a true value for the user-defined clock net in the Boolean expression;

obtain a negative cofactor of the Boolean expression by substituting a false value for the user-defined clock net in the Boolean expression; and evaluate an expression that one of the positive and negative cofactors with respect to the user-defined clock net is a constant function and an other one of the positive and negative cofactors is a non-constant function, the expression corresponding to the cofactor condition.

13. A system comprising:

a processor; and a memory coupled to the processor, the memory having program code, the program code when executed by the processor causing the processor to:

determine a gating circuit having a gated clock net that drives a clock input of a sequential element, the sequential element receiving a first input net at a data input and generating an output net, the gating circuit having a user-defined clock net, and transform the gating circuit to provide it second input net to the sequential element based on a cofactor condition of the gating circuit, wherein the program code causing the processor to transform causes the processor to:

obtain an enable net; and reconnect the user-defined clock net and the first input net;

wherein the program code causing the processor to reconnect causes the processor to:

disconnect the gated clock net from clock input of the sequential element, connect the user-defined clock net to the clock input of the sequential element, combine the enable net with an existing not connected to the enable input if the sequential element has an enable input, the combined enable net and the existing net being connected to the enable input, and if the sequential element does not have the enable input and there is a library element having a library enable input and functionally equivalent to the sequential element, replace the sequential element with the library element, reconnect output pin and equivalent inputs of the sequential element to the library element, connect the enable net to the library enable input of the library element, and remove the sequential element.

14. The system of claim 13 wherein the program code causing the processor to obtain the enable net causes the processor to:

copy the gating circuit to a copy circuit;

set clock input of the copy circuit to one of a true and complement user-defined clock net;

propagate the set clock input through the copy circuit; and set the enable net as the gated clock net in the copy circuit.

15. The system of claim 13 wherein the program code causing the processor to reconnect further causes the processor to:

create a selector circuit if the sequential element does not have an enable input and there is no equivalent element in the library, the selector circuit having a first input, a second input, a select input, and a selector output corresponding to the second input net, the selector circuit selecting the first input when the select input is asserted and selecting the second input when the select input is negated;

disconnect the first input net from the data input of the sequential element;

connect the first input net to the first input;

connect the output net to the second input;

connect the gated clock net to the select input of the selector circuit; and connect the selector output to the data input of the sequential element.

* * * * *